United States Patent [19]
Flores

[11] Patent Number: 5,701,751
[45] Date of Patent: Dec. 30, 1997

[54] APPARATUS AND METHOD FOR ACTIVELY COOLING INSTRUMENTATION IN A HIGH TEMPERATURE ENVIRONMENT

[75] Inventor: Aaron G. Flores, Sugar Land, Tex.

[73] Assignee: Schlumberger Technology Corporation, Houston, Tex.

[21] Appl. No.: 646,675

[22] Filed: May 10, 1996

[51] Int. Cl.$^6$ ............................................. F25B 19/00
[52] U.S. Cl. ........................ 62/169; 62/259.2; 62/260; 165/104.21; 165/104.33
[58] Field of Search .................. 62/169, 268, 260, 62/259.2; 165/45, 80.2, 80.4, 104.21, 104.27, 104.33, 104.34

[56] References Cited

U.S. PATENT DOCUMENTS

| | | | |
|---|---|---|---|
| 2,671,323 | 3/1954 | Richert | 62/259.2 |
| 2,711,084 | 6/1955 | Bergan | 62/259.2 |
| 5,265,677 | 11/1993 | Schultz | 62/259.2 |
| 5,522,452 | 6/1996 | Mizuno et al. | 62/259.2 |

Primary Examiner—Harry B. Tanner
Attorney, Agent, or Firm—Brigitte L. Jeffery; Darcell Walker; John J. Ryberg

[57] ABSTRACT

An apparatus and method are disclosed for actively cooling instrumentation, in particular electronic circuits, in especially, high temperature environment. This apparatus has a tank containing a cooling agent, a heat exchanger to transfer heat from the instrumentation to the cooling agent, a compressor and a tank to hold cooling agent removed from the first tank. In this operation, the cooling agent tank is located in close proximity to the instrumentation. As the instruments generate heat, the heat is transferred through the heat exchanger to the cooling agent. The cooling agent boils and vaporizes from the heat and is pumped out of the tank by a compressor. As the cooling agent vaporizes and is pumped out of the tank, heat contained in the cooling agent is transferred out of the tank as well. The rate at which the vapor is pumped out of the tank controls the temperature of the cooling agent in the tank. The vapor is compressed under pressure and pumped to a storage tank where the vapor condenses back to a liquid.

16 Claims, 8 Drawing Sheets

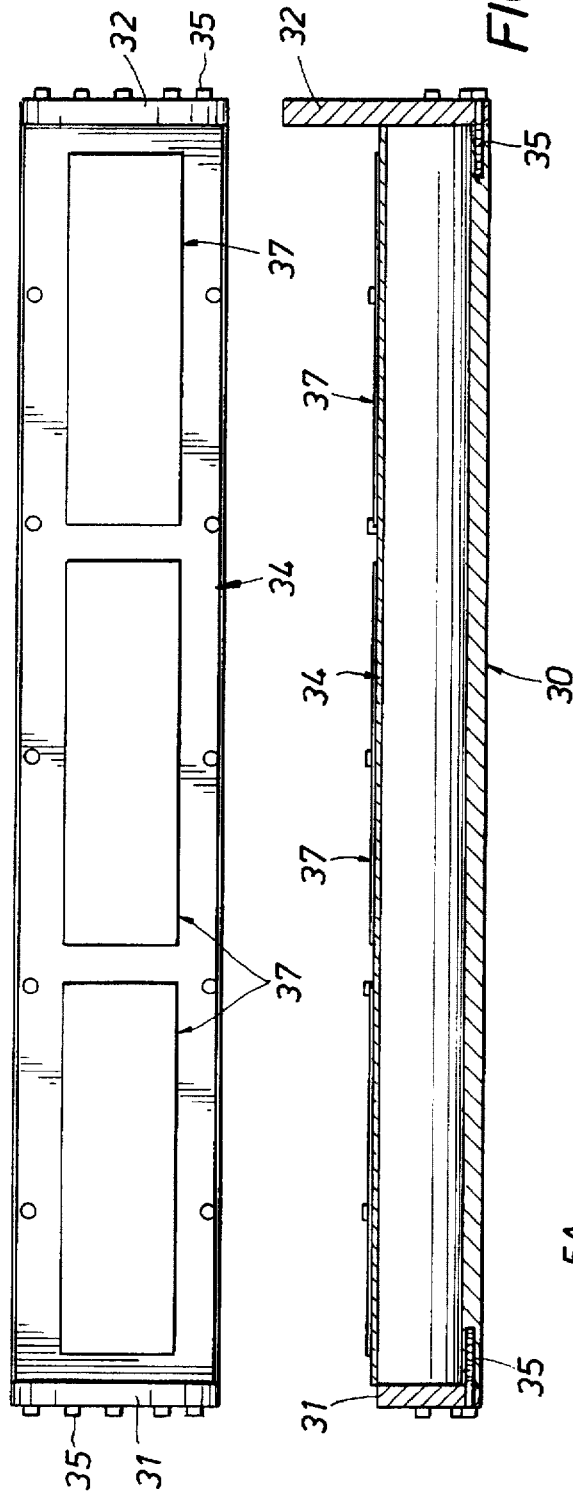

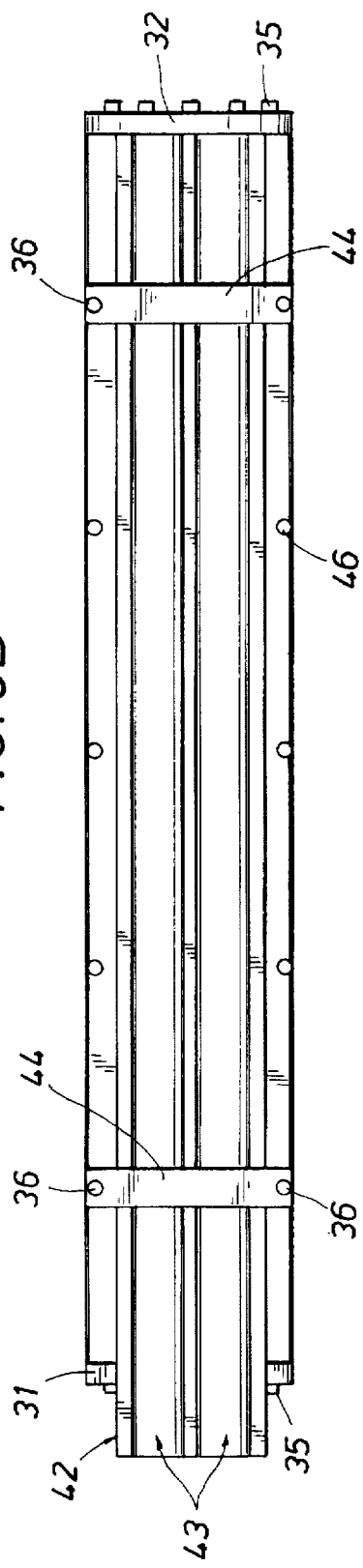
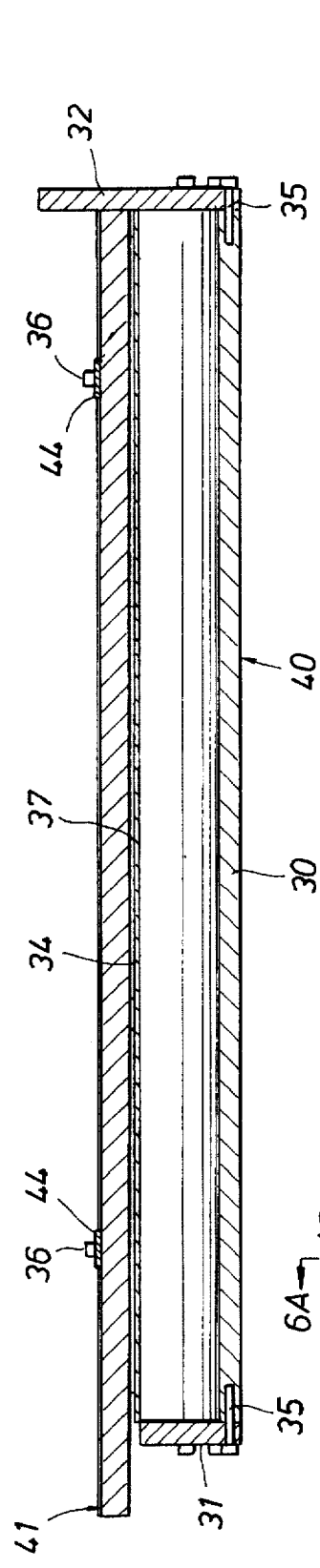
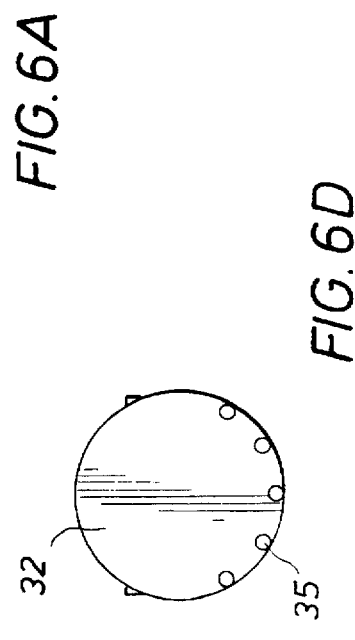
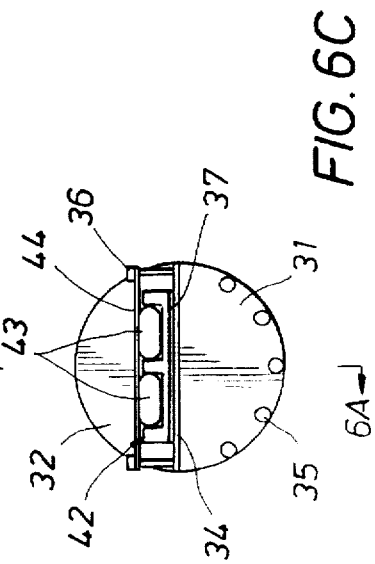

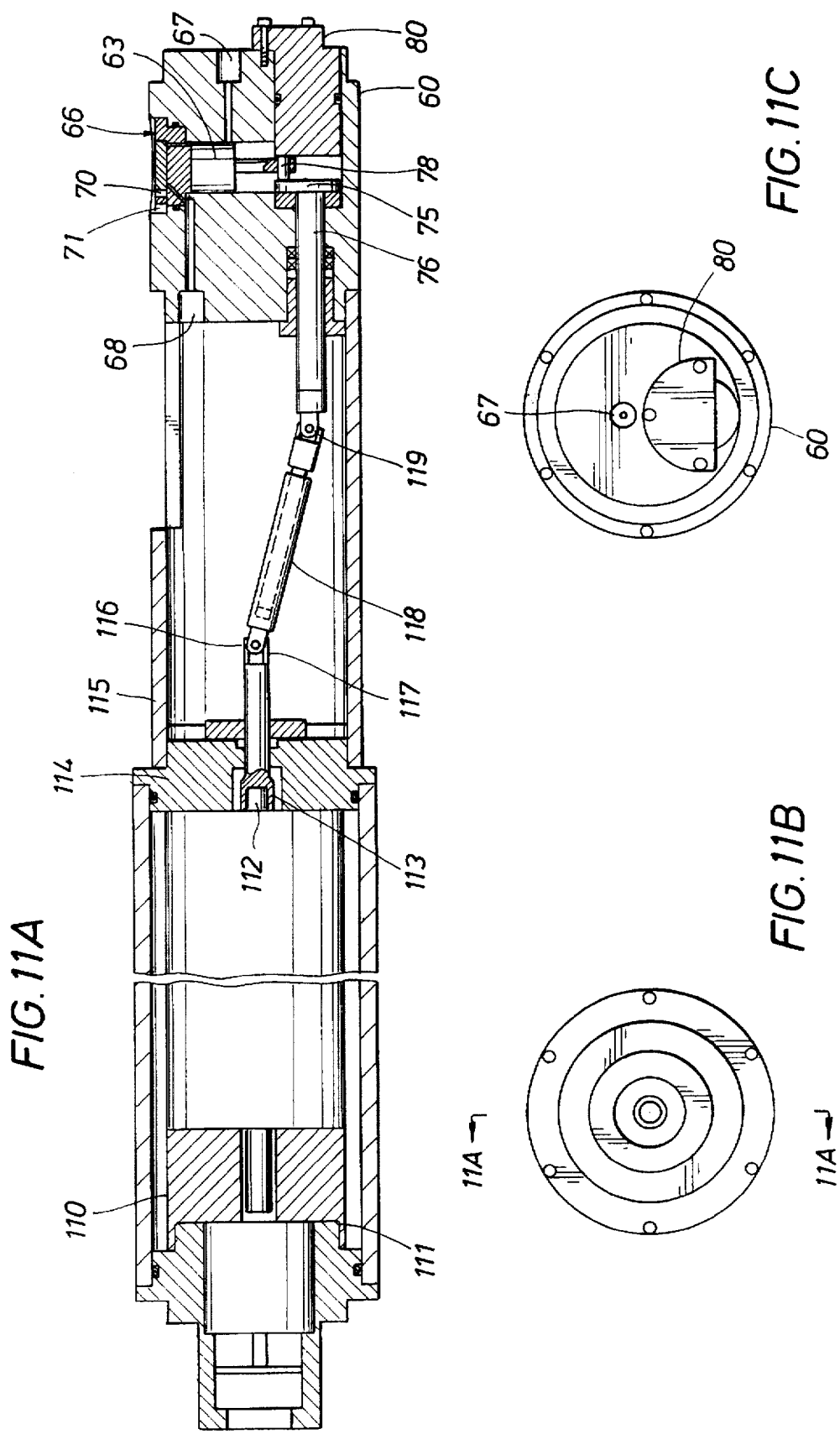

APPARATUS AND METHOD FOR ACTIVELY COOLING INSTRUMENTATION IN A HIGH TEMPERATURE ENVIRONMENT

FIELD OF THE INVENTION

This invention relates to an apparatus and method for cooling instruments in an apparatus while operating that apparatus in high temperature environments. In particularly it relates to the use of a cooling agent to cool the electronics in a logging tool when the tool is exposed to earth formation temperatures and thereby preventing tool failure.

BACKGROUND OF THE INVENTION

The environment encountered by downhole oil exploration tools can be very severe. Temperatures up to and in excess of 200° C. and pressures up to $1.38 \times 10^8$ Pa are not uncommon. Consequently, producers of oil exploration tools must design robust tools that can operationally sustain these harsh conditions for extended lengths of time. Perhaps the most challenging of all conditions to design electronics that can reliably operate in high temperature environments. Standard electronic components are usually rated to operate only up to approximately 125° C. Thus, it becomes necessary to create or experimentally find electric components that can survive the high temperatures existing downhole. Since the components are constantly changing via new manufacturing techniques, updates, etc., this process of creating electronic components is expensive, time consuming, and never ending. In an effort to combat the high temperature requirement of electronics, the chassis or electronics compartments in downhole tools could be kept at or below 125° C.

Today, tools rated to 175° C. are sometimes inserted into Dewar Flasks when exploring boreholes in excess of 175° C. Dewar Flasks act to insulate the tool electronics and to slow the heating of the electronic chassis similar to a large "thermal bottle". The flask is a passive system that extends the downhole residence time of the tools by approximately four to six hours. Often the downhole residence times required for exploration are much greater than those offered by the expensive Dewar Flask system.

The problem at hand points toward the need for an active cooling system that can maintain the electronic chassis below 125° C. for extended lengths of time. Standard electronics could then be used without the need for the expensive high temperature components.

Active cooling systems already exist for a variety of applications such cooling food products, motor vehicles and buildings. These active cooling systems, better known as air conditioners and refrigerators, can effectively operate for extended periods of time with little to no maintenance. A cooling system makes heat move. It takes heat from one location and moves it to another location. The location from which heat was removed obviously becomes colder. For example, a refrigerator takes heat out of the inside and moves it to the outside. The heat flows into the air and the inside, having lost heat, becomes colder.

Vapor compression active cooling systems work by evaporation. When a liquid turns into a vapor, it loses heat and becomes cooler. This change is because the molecules of vapor need energy to move and leave the liquid. This energy comes from the liquid; the molecules left behind have less energy and so as a result, the liquid is cooler.

For an active cooling system to work continuously, the same cooling agent (etc., Freon) must be repeatedly used for an indefinite period. These cooling systems have three basic patterns: the vapor-compression system, the gas-expansion system and the absorption system. The vapor-compression system is the most effective and is used more extensively than the other arrangements. The vapor-compression system consists of four main elements: an evaporator, a compressor, a condenser and an expansion device.

Referring to FIG. 1, in the evaporator 1, the cooling agent boils (evaporates) at a temperature sufficiently low to absorb heat from a space or medium that is being cooled. The boiling temperature is controlled by the pressure maintained in the evaporator, since the higher the pressure, the higher the boiling point. The compressor 2 removes the vapor as it is formed, at a rate sufficiently rapid to maintain the desired pressure. This vapor is then compressed and delivered to a condenser 3. The condenser dissipates heat to circulating water or air. The condensed liquid cooling agent, which is now ready for use in the evaporator 1, is then sharply reduced in pressure by passing it through an expansion valve 4. Here, the pressure and temperature of the cooling agent drop until they reach the evaporator pressure and temperature, thus allowing the cooling cycle to repeat.

During expansion some of the liquid of the cooling agent flashes into vapor so that a mixture of liquid and flash vapor enters the evaporator. In a cooling system, the low pressure in the evaporator is set by the cooling temperature which is to be maintained. The high pressure maintained in the condenser is determined ultimately by the available cooling medium (etc., the temperature of circulating water or the atmosphere air temperature. The process is one in which the cooling agent absorbs heat at a low temperature and then under the action of mechanical work, the cooling agent is compressed and raised to a sufficiently high temperature to permit the rejection of this heat. Mechanical work or energy supplied to the compressor as power is always required to raise the temperature of the system.

To further explain the cooling process, the four major components are examined in greater detail. The evaporator 1 is the part of the cooling system in which the cooling is actually produced. The liquid cooling agent and vapor from the expansion valve 4 are introduced into the evaporator. As the liquid vaporizes, it absorbs heat at low temperature and cools its surroundings or the medium in contact with it. Evaporators may be direct expansion (acting directly to cool a space or product) or they may operate as indirect-expansion units to cool a secondary medium, such as water or a brine which in turn is pumped to a more distant point of utilization. A domestic refrigerator, for example, is a direct-expansion unit in that its evaporator, directly cools the air in the food compartment and also directly contacts the water trays used for making ice. Evaporators vary greatly in design, with those used for cooling air often made as continuous pipe coils, with fins mounted outside the pipes to give greater surface contact to the air being chilled. For cooling liquid, such as a brine water, the shell and tube arrangement is common in this case, the brine passes through tubes surrounded by the boiling (evaporating) cooling agent, which is contained in a larger cylindrical shell. The brine tubes, in turn, are welded or rolled into tube sheets at the end of the shell to prevent leakage of the cooling agent from the shell or into the brine circuit.

The expansion valve 4 that feeds the evaporator must control the flow so that sufficient cooling agent flows into the evaporator for the cooling load but not in such excess that liquid passes over to the compressor, with the possibility of causing damage to it.

The compressor 2, the key element of the system, can be powered by means such as electric motor, steam or internal combustion engine, or steam or gas turbine. Most compressors are of the reciprocating (piston) type and range from the fractional-horsepower size, such as those found in domestic refrigerators or in small air-conditioning units, to the large multi-cylinder units that serve large industrial systems. In these large multi-cylinder units, capacity can be controlled with automatic devices that prevent the in certain cylinders from closing. For example, in a six-cylinder unit, if the valves are held open on two of the cylinders to keep them inoperative, the capacity of the machine is reduced by one-third when operating at normal speed.

Centrifugal compressors are used for large refrigeration units. These compressors employ centrifugal impellers that rotate at high speed. Centrifugal compressors depend for their compression largely on the dynamic action of the gases themselves as they flow in the diffusion passages of the compressor. These compressors can be large centrifugal compressors made with a single impeller or with two to four or more impellers in series, to compress the gas through the range required. These compressors are used extensively for large air-conditioning installations and also for usage in the industrial field when gases are compressed for liquefaction or for transportation, such as in the natural-gas industry, and when air is compressed to produce liquid oxygen or nitrogen.

The condenser 3 of a vapor system must dissipate heat from the hot vapor it receives from the compressor and condense this vapor to liquid for reuse by the evaporator. Condensers either dissipate heat to the ambient atmosphere through externally finned surfaces or by a shell and tube arrangement in which the vapor delivers heat to a circulating fluid (etc.: water) that passes through tubes contacting the cooling agent vapor. The temperature of the .vapor is kept above that of the circulating water or air by compression to insure that heat is transferred to the coolant; thus, when the vapor is allowed to expand, its temperature drops well below that of the cooling agent.

Double-pipe condensers are also used. In such units, the cooling agent vapor and condensate pass in one direction through the annular space between the two tubes, while the water, flowing in the opposite direction through the central tube, performs the cooling function.

The air conditioning concept works on the principle of exchanging heat from a heated substance to a cold substance. In this principle, the temperature from a hot substance (such as a fluid) is transferred to a cold fluid. As the temperature of the hot fluid decreases, the temperature of the cold fluid increases. Heat exchangers are manufactured in many different designs and are used extensively in various industries. Heat exchangers are given different names when they serve a special purpose. Thus boilers, evaporators, superheaters, condensers and coolers may all be considered heat exchangers.

An example of a heat exchanger is illustrated in FIG. 2a and explains the basic operation of a hat exchanger. This exchanger is constructed from two pipes 5 and 6 in a concentric arrangement. Inlet and exit ducts are provided for the two fluids. In the sketch, the cold fluid flows through the inner tube 7 and the warm fluid via inlet pipe 5 in the same direction through the annular space between the outer and the inner tube. This flow arrangement is called parallel flow. In it heat is transferred from the warm fluid through the wall of the inner tube (the so-called heating surface) to the cold fluid. The temperature in both fluids varies as shown in FIG. 2b. In plot 9, the temperature of the warm fluid decreases from $t_{\omega 1}$ to $t_{\omega 2}$. In plot 10, the temperature of the cold fluid increases from $t_{c1}$ to $t_{c2}$. The amount of heat Q that is transferred from one fluid to the other per unit of time, called heat flow, can be calculated from the following equation:

$$Q = mc(t_2 - t_1) \quad (1)$$

This equation states that the heat flow Q(kW) can be obtained by multiplying the mass per unit of time of fluid m(kg/sec) by the specific heat c(KJ/kg-°C.) of the fluid and by the temperature increase $t_2-t_1$(°C.) of the fluid entrance to the exit of the heat exchanger. The specific heat is a property of the fluid involved and its current state. The amount of heat leaving the warm fluid must be the same as the amount of heat received by the cold fluid. The mass flow and the temperature increase for the cold or the decrease for the warm fluid can therefore be entered into equation (1). The heat exchanger may have to be designed, for example, to increase the temperature of a prescribed mass per unit time $m_c$ of cold fluid from $t_{c1}$ to $t_{c2}$. Entering these value into equation (1) then determines the heat flux Q which has to be transferred in the heat exchanger. This value will be needed in the following discussion to calculate the heating surface of the exchanger.

The temperature difference $\Delta t_1$ between the fluids at the entrance of the heat exchanger decreases to the value $\Delta t_2$ at the exit, as illustrated in FIG. 2a. A heat exchanger is operated in counterflow when the direction of one of the fluids is reversed. The counterflow arrangement has the advantage that the exit temperature $t_{c1}$ of the colder fluid can be increased beyond the exit temperature $t_{w2}$ of the warm fluid. In addition, a smaller surface area is required in counterflow than in parallel flow to transfer the same amount of heat. This is so because the mean temperature difference $\Delta t_m$ in the counterflow heat exchanger, for a given heat flux and prescribed inlet temperatures, is higher than in the parallel-flow exchanger.

The heating surface of the heat exchanger can be obtained from the equation:

$$A = \frac{Q}{U \Delta t_m} \quad (2)$$

The equation indicates that the required surface area A (m²) is obtained by dividing the heat flux Q obtained with equation (1) by the overall heat transfer coefficient U and the mean temperature difference $\Delta t_m$(°C.). Larger heat exchangers utilize a bundle of tubes through which one of the fluids flows. The tubes are enclosed in a shell with provisions for the other fluid to flow through the spaces between the tubes. Fluid flowing outside the tubes can be directed either in the same direction as or counter to the effective flow in the tube bundles. In the latter arrangement, parallel or counter flow can be approximated in the way shown in FIG. 2a. In another arrangement, the cold fluid is distributed in such a manner that it flows in parallel through the tubes forming the heating surface and is then collected by a header. This arrangement creates a cross flow, as shown schematically in FIG. 2a. In nuclear reactors, fuel rods may replace the tubes, and the cooling fluid flowing around the rods removes the heat generated by the fission process. In a similar way, rods containing electric resistance heaters may supply heat to the fluid passing through the exchanger between the rods.

As previously mentioned, there is a need for a downhole cooling system that can keep logging tool electronics cool in order to avoid tool failure from the extreme downhole temperatures. There have been attempts to apply the refrigeration concept to downhole tools. In 1977, Mechanics Research attempted to develop a system that incorporated a refrigeration technique for use in a geothermal well. The system design was to be a closed system that would operate continuously, similar to the refrigerator cooling concept of FIG. 1. However, the specific objective of the project was to develop a compressor for such a system. The project did not achieve its chief objectives. Therefore, a need still remains for a system that can actively cool instrumentation in a high temperature environment.

SUMMARY OF THE INVENTION

In the present invention, an active cooling system allows constant low pressure vaporization of a tank of water while in thermal communication with the electronic chassis of downhole logging tool. The tool electronics and a lower tank of water are in thermal communication with one another via a cold heat exchanger. The heat from the electronics, as well as that from the hot borehole (up to approximately 200° C.) causes the water in the lower tank to boil or vaporize into steam. As the water vaporizes, the steam is removed from the tank and compressed via a compressor to an upper tank. By removing the steam from the lower tank as it is generated, its pressure and resulting temperature can be regulated and thereby regulating the temperature of the electronics. For instance, the temperature of lower tank can be maintained at approximately 100° C. if its internal pressure is kept at approximately $1.01 \times 10^5$ Pa (14.7 psi). The vapor in the upper tank must be compressed to a pressure greater than the saturation pressure of the steam at the temperature of the borehole in order to empty the lower tank. A 200° C. borehole would require a pressure of $1.55 \times 10^6$ Pa (225 psi). Once the steam enters the upper tank, it is allowed to cool to the borehole temperature. Thus, the upper tank serves as the hot heat exchanger in the system. A control system between a lower tank pressure sensor and the compressor maintains a constant pressure vaporization in the lower tank. Once the lower tank is emptied of water, the system is spent and the tool must return to the surface and the tank refilled. Likewise, the upper tank must be emptied before the tool re-enters the borehole.

Three major subsystems are combined in the present invention as shown in FIG. 3. The subsystems are the compressor 11, the cold heat exchanger (evaporator) 10 and the hot heat exchanger (condenser) 12. In addition, a sample wireline electronics chassis including heat-dissipating electronics is implemented. A schematic of the present invention in its simplest form is shown in FIG. 4. The evaporator 17 encompasses a lower tank of stored water 16 in thermal contact with a cold heat exchanger 18 from the electronics and is all within a Dewar flask 15. This system allows the heat from conduction into the flask and electronic component dissipation, to be transferred to the tank of water. Consequently, the water begins to vaporize. The second major component is the compressor 23. The compressor maintains the lower tank 17 at the specified atmospheric pressure value. It accomplishes this task by pulling the vaporized water or stream out of the lower tank and transporting it into the upper tank or hot heat exchanger 24, outside the Dewar flask. Thus, the compressor must attain pressures greater or equal to the saturation pressure of water at a given borehole temperature, along with the flowrates of stream produced by the total cooling load. For instance, the worst-case-scenario of a 200° C. borehole requires compressor outlet pressures equal to or greater than $15.5 \times 10^5$ Pa and a flowrate equal to $3.5 \times 10^{-5}$ kg/s at the 80-W cooling load. The upper tank/hot heat exchanger 24 is simply a tank to which the compressed stream is transported and allowed to condense at borehole temperatures. The volume of the upper tank should be sized at least 1.16 times larger than the lower tank due to the increased specific volume of saturated water at 200° C. over that at 100° C. Additionally, with knowledge of worst-case heat transfer coefficients in the downhole system, the upper tank must be made thermally conductive towards the borehole. Heat transfer of the cooling load and compressor work must be accomplished with as small a temperature as possible over that of the borehole.

BRIEF DESCRIPTION OF THE DRAWINGS

FIG. 5 is a diagram of a sample electronics chassis.

FIG. 6 is a diagram of a cold heat exchanger.

FIG. 11 is a diagram of the compressor/motor assembly.

DETAILED DESCRIPTION OF THE INVENTION

Figure 1:
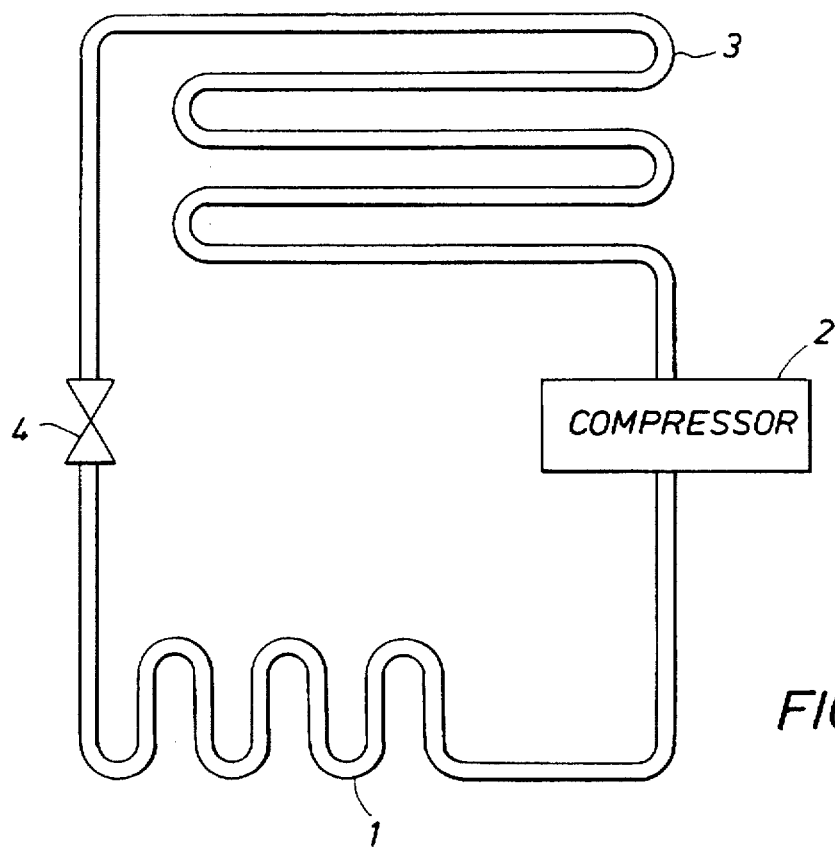
FIG. 1 is a schematic of the components of a refrigeration cooling concept.
Figure 3:
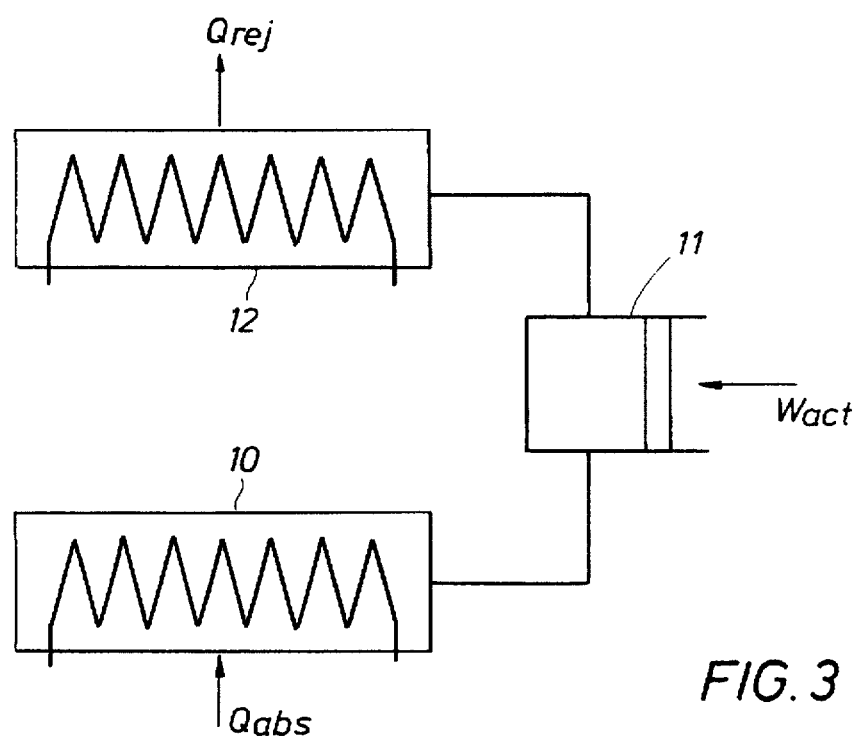
FIG. 3 is a diagram of the hybrid vapor compression once-through system of the present invention.
Figure 2A:
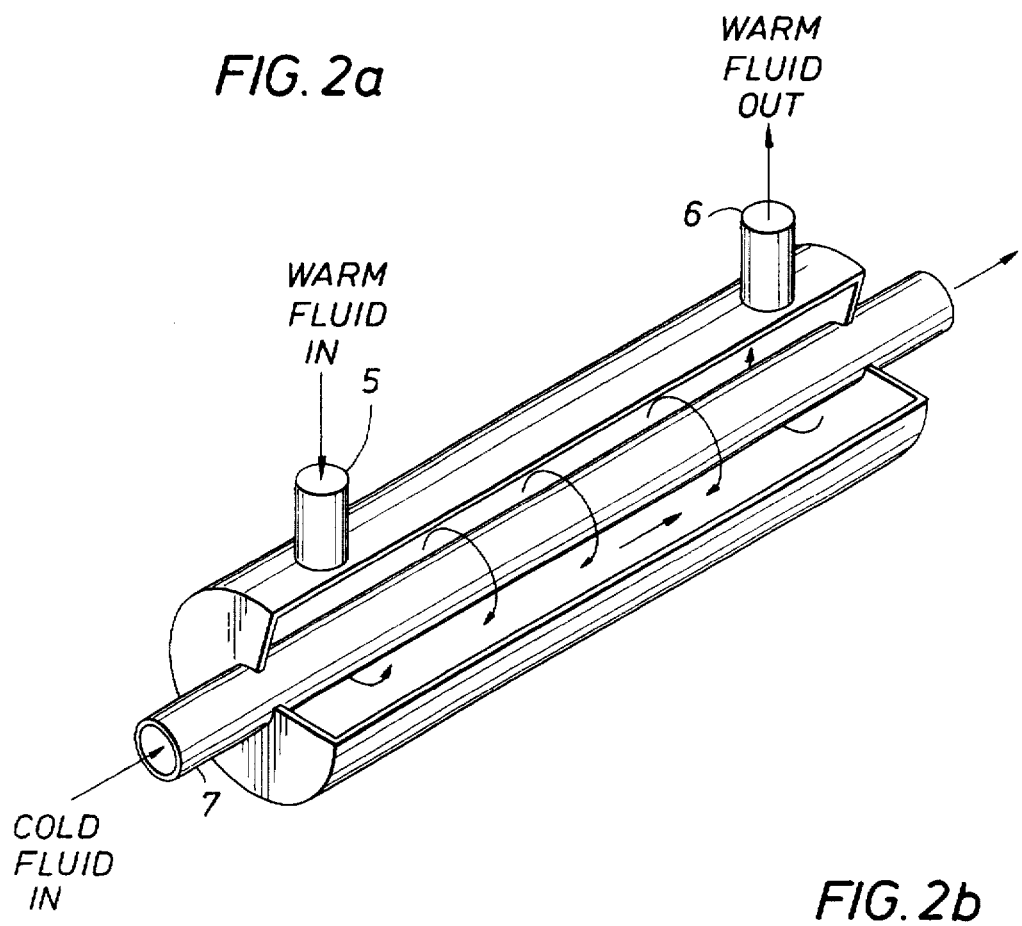
FIG. 2a is an isometric cross-sectional view of a parallel-flow heat exchanger.
Figure 2B:
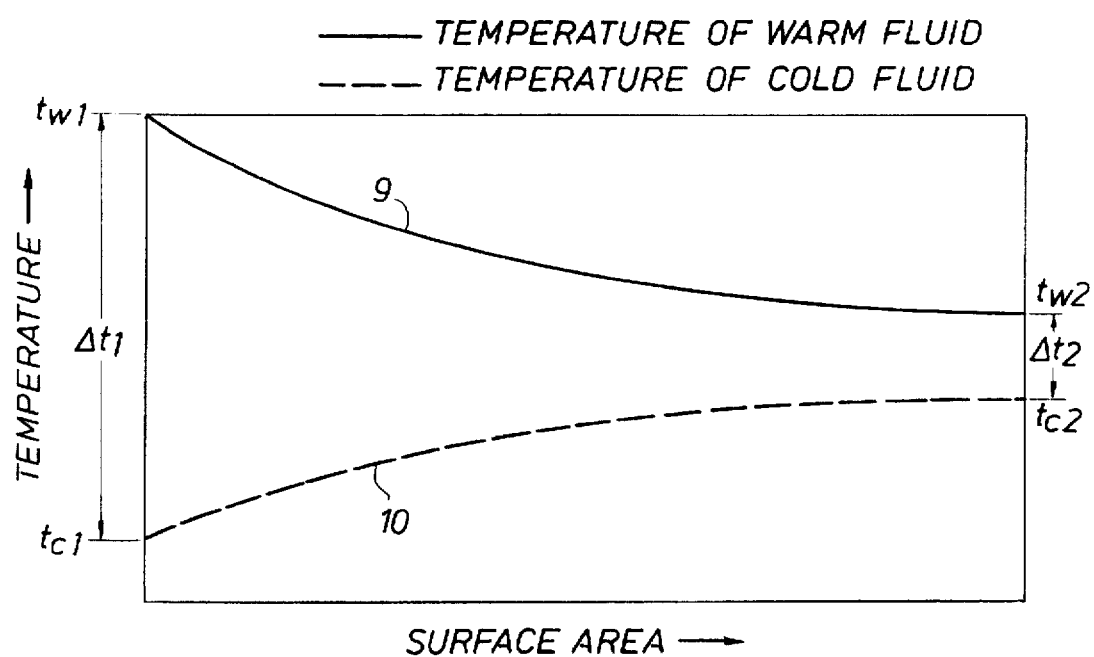
FIG. 2b is a graph of the changes in fluid temperatures that take place in the parallel heat exchanger.
Figure 4:
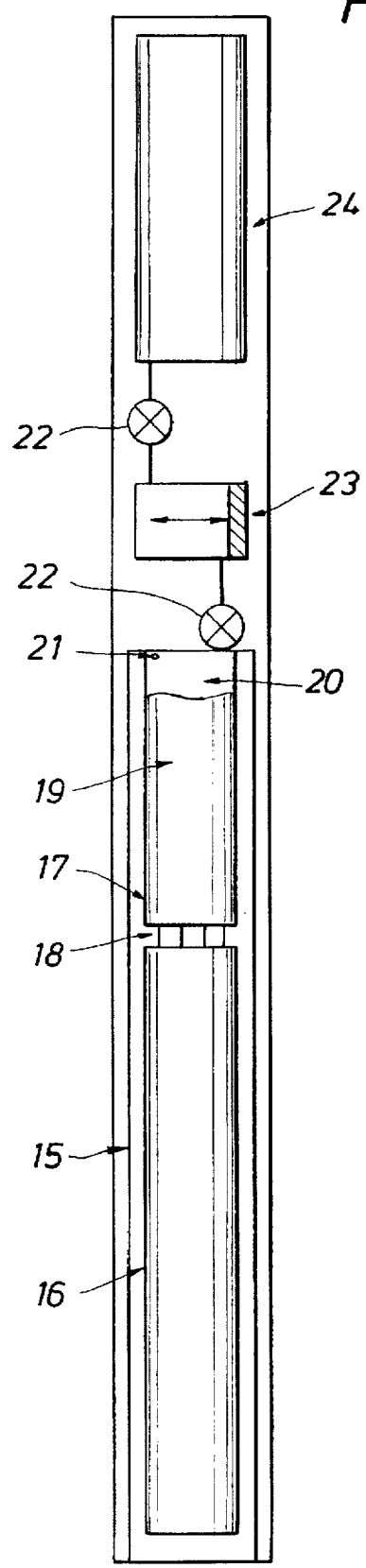
FIG. 4 is a diagram of the active cooling system of the present invention.

The overall assembly of the invention is shown in FIG. 4 and includes the sample electronics 16, lower tank/cold exchanger 19 (evaporator), compressor 23, lubrication system, and upper tank/hot heat exchanger 24 (condenser) assemblies. The invention is described in the context of a designed and manufactured prototype of the invention. Although not downhole compatible, aluminum pieces were used in the prototype. Aluminum was used in the tubes of the lower and upper tanks, and the compressor valve head piece. In practice, the tubes of the upper tank and compressor valve head piece should not be made of aluminum in a downhole design.

FIG. 5 shows the electronic chassis assembly containing the logging tool electronics. The detailed assembly drawings are given in Appliant's publication entitled "Active Cooling for Electronics in a Wireline Oil-Exploration Tool", Massachusetts Institute of Technology, June 1996. The chassis has a base 30 made of aluminum. The diameter and lengths of the chassis are 0.0699 m and 0.43 m, respectively. End pieces 31 and 32 are connected to the chassis base 30 by screws 35. End piece 31 is connected to a lower tank and is therefore smaller in length than end piece 32. A breadboard 34 containing electronic components is attached to the chassis as shown. It is attached to the base via screws 36. The breadboard contains the electronic components 37. In the test structure, Kapton Strip heaters serve as the electronics. These heaters have a resistance of 15.68 ohms and when connected in parallel have a total resistance, R, of 6.4 ohms at a temperature of 100° C. The sample electronics are powered by a Hewlett Packard #6443B DC power supply. The voltage, $v_{heat}$ required to produce an electronic heat dissipation, $P_{heat}$ is equal to:

$$v_{heat} = \sqrt{P_{heat}R_l} \qquad (3)$$

Electronics heat dissipation values between 0 W and 50 W are available with the given power supply.

FIG. 6 shows the cold heat exchanger assembly. As shown, the electronic chassis 40 has a chassis base piece 30, end pieces 31 and 32, sample electronics 37 attached to a breadboard 34. Also shown is a portion of a cold heat exchanger 41 adjacent the electronics 37. Heat pipe holder 42 contains heat pipes 43. The heat pipes 43 are mounted in the channels of the holder. A heat pipe brace 44 secures the pipes in the holder 42. Screws 36 and 46 secure the heat exchanger and heat pipe brace.

Figure 7B:
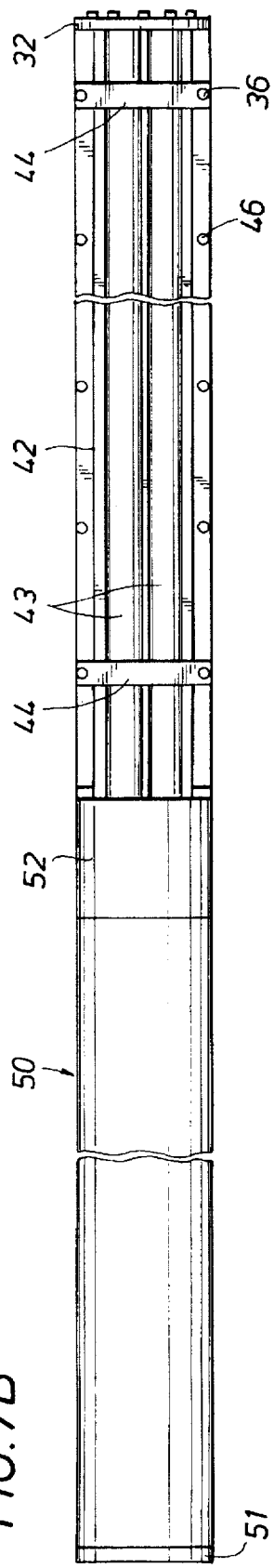
FIG. 7 is a diagram of the cold heat exchanger and lower tank assembly of the present invention.
Figure 7A:
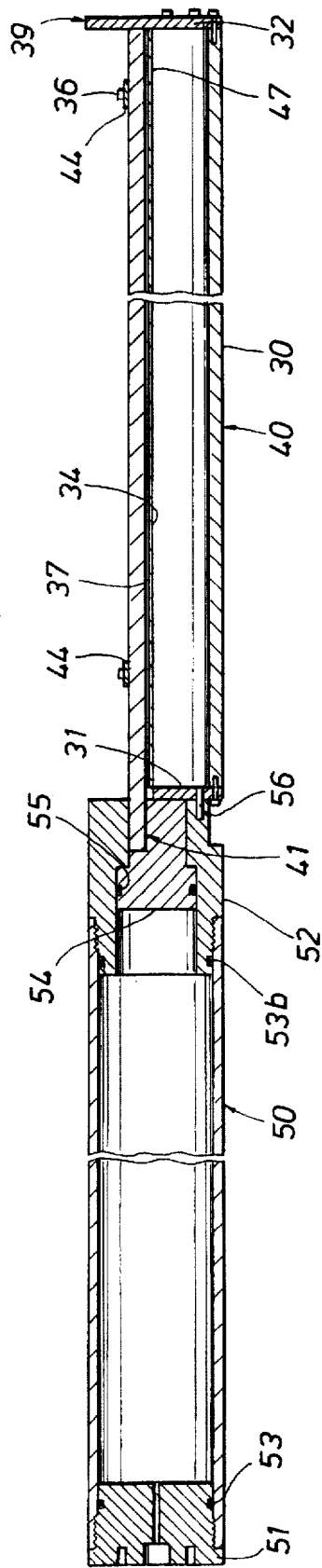
Figure 7C:
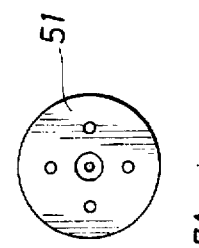

In FIG. 7, the heat exchanger prototype 39 has two 0.457 m by 0.0165 m by 0.00660 m, Noren Products flat TPhcBS heat pipes 43 mounted on an aluminum holder 42 that is placed on a thin, high thermal conductive pad (Berquist Co. Sil Pad 400) insulator 47 on top of the Kapton strip heaters 37. The heat pipes transfer the heat from the electronics 37 to the water contained in the lower tank 50 through an aluminum mating piece 54. The mating piece 54 is in contact with the heat pipes 43 through the heat exchanger portion 41. A screw 56 attaches the heat exchanger to the lower tank. The air gaps between the heat pipes, aluminum holder and aluminum mating piece are eliminated by filling these gaps with a high thermally conductive Dow Corning 340 heat sink compound. An O-ring 55 provides a seal between the lower tank and the heat exchangers to prevent water flow to the electronics. Two other O-rings 53 and 53b are located at the uphole end 51 and the downhole end 52 of the lower tank. The lower tank 50 is sized to fit into the flask and carry 1 kg of water. The volume of the lower tank is approximately 0.001 m³. However, when the system is laid in the horizontal position with the exit of the tank in the center of the cross-section, the effective volume of the tank is halved. Thus, only 0.5 kg of water can be carried in the lower tank in horizontal tests.

The flask used in the present invention is a UDFH-KA Dewar flask manufactured by National K-Works. The flask properties and diameter dimension schemes are detailed in Chapter 3 of the inventor's dissertation entitled "Active Cooling for Electronics in a Wireline Oil-Exploration Tool" Massachusetts Institute of Technology, June 1996. The flask has a total length of 2.36 m and a payload or insulated length of 1.71 m. The ends of the flask are insulated with Teflon shavings.

Figure 8:
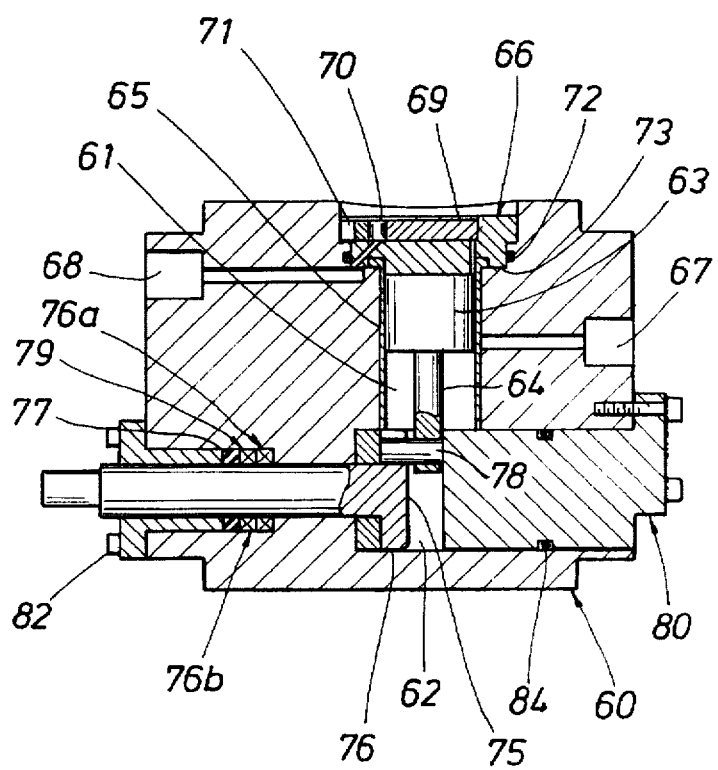
FIG. 8 is a diagram of a compressor assembly.

FIG. 8 displays the compressor assembly used in the active cooler. The compressor is composed of several mechanical parts. The outer housing 60 of the compressor contains two volumes: the compression chamber 61 and the crankshaft chamber 62. In the compressor chamber is a piston 63, piston rod 64, piston cylinder 65 and valve head piece 66. The piston cylinder guides the stroke of the piston. The piston/cylinder seal is a dynamic lapped design with the piston made of mehanite and the cylinder made of 12L14 steel. These parts were manufactured to last for approximately 126 million strokes at a temperature of 232° C. These specifications equal a downhole time of approximately 1000 hours at compressor shaft speeds of 2000 rpm.

The intake port 67 is located at the bottom of the piston stroke and the exit port 68 is located at the top of the piston stroke. In operation, as the piston travels downward, a small vacuum is created in the compression chamber. The port 67 is exposed as the piston crosses its surface and steam is sucked into the compression chamber volume. On the upward stroke of the piston, the port 67 is sealed by the circumferential area of the piston and lubricant. The steam is compressed by the upward motion of the piston. This high pressure vapor exits via the compression valve head piece 66 and port 68. A miniature Lee check valve 69 is placed in the valve head piece and serves as the exhaust valve in the compressor. The valve is hard-mounted in the compressor head piece. A miniature spacer 70 and Lee mechanical plug 71 keep the check valve 69 in a pressure-sealed position. To filter large particles from the vapor flow, a small 40 μm Mectron Industries, Inc. filter 73 is placed in front of the miniature check valve in the valve head piece on the chamber inlet side. The filter keeps contaminants from entering and plugging the valve, especially during the break-in period of the seal. In this design, an intake valve is eliminated, along with its design complexities and inefficiencies.

The valve head piece 66 utilizes a 95 durameter viton o-ring 72 to isolate the compression chamber volume from the environment. The piston stroke is controlled by the spinning of the crankshaft assembly. The crankshaft assembly is made from a crankshaft 75, bearings 76 and 76b, a rotary seal 77 and a pin welded 78 into the shaft. In operation, the crankshaft pin 78 is inserted in the piston rod 64. When the crankshaft is rotated the piston 63 moves up and down. Two different, but standard-sized ball bearings 76 and 76b guide the rotation of the crankshaft. A Greene-Tweed steam-service rotary seal 77, spacer 79 and bearings 76 are contained in the compressor assembly by an end piece 82 held in place by six socket head screws. The crankshaft is held inside the compressor by an end piece 80 which is held in place by three socket head screws. This end piece also utilizes a 95 durameter viton o-ring 84 for pressure isolation between the compressor internals and the environment. For compatibility with the rotary seal, a hardness of 45–55 Rc is specified for the crankcase. As mentioned earlier, the piston connecting rod is taken directly from the Fox 40-size engine.

Figure 9A:
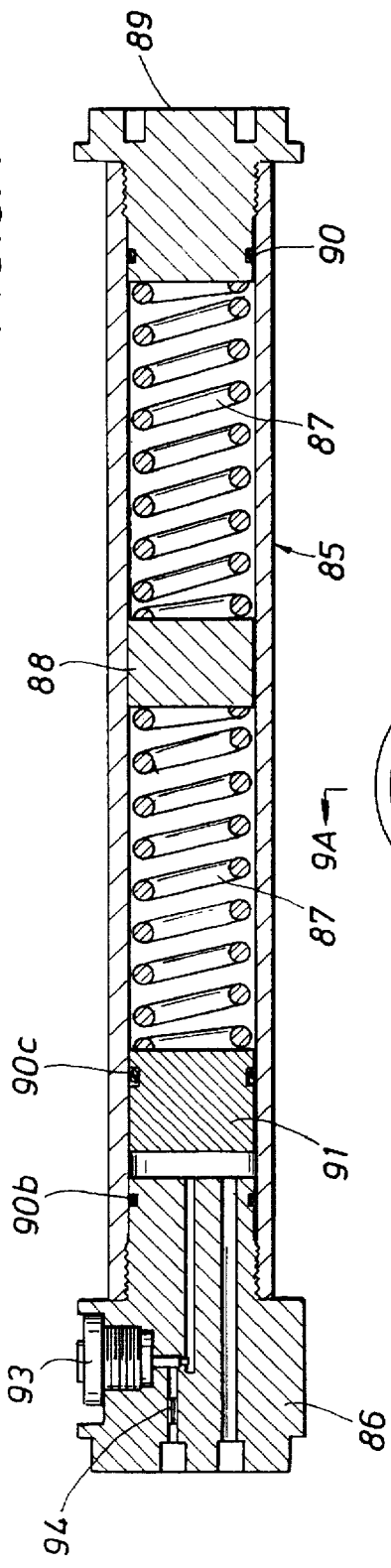
FIG. 9 is a diagram of the lubrication assembly of the present invention.
Figure 9B:
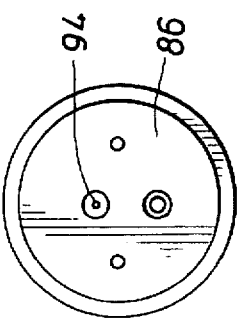

FIG. 9 shows the lubricant system for the compressor. This system has a lubricator tube 85, with a lubricator piece 86. Lubricant in the tube is maintained under pressure and is compensated by two springs 87 in series. These springs 87 are separated by a spacer 88. The springs are contained on one end by the end piece 89. The end piece and lubricator piece utilize a 95 durameter viton o-ring 90 and 90b for pressure isolation from the environment. The other end of the springs is contained by a piston 91. The springs apply force to the piston which then applied pressure to a lubricant stored on the other side of the piston. The piston maintains the lubricant seal with a 95 durameter viton o-ring 90c. A three-way normally-closed, high-temperature Lee Co. solenoid valve 93 is periodically opened and closed as a function of time, allowing lubricant to travel into the compressor intake line through a Lee Co. Visco-Jet restrictor 94. The restrictor piece restricts the flow of lubricant to lower flowrates than that of the solenoid valve alone. Both the restrictor and valve pieces are located in the lubricator piece. From the intake line, the lubricant travels into the compression chamber of the compressor and maintains the dynamic lapped pressure seal. Some lubricant also "blows-by" the seal and serves to lubricate the crankcase internals. A hydraulic line is connected to the lower line on the lubricator piece that contains the solenoid valve and is used to fill the lubricant reservoir before operation. The lubricant inlet line is then plugged during operation.

Lubricant is periodically pumped into the reservoir under pressure. The reservoir pressure is measured by a pressure gage. In practice, a screw-drive system could maintain the reservoir pressure autonomously. The lubricant used in the final tests was Dow Corning-200, 500 cSt Silicone oil, however, the choice of lubricant should be based on trying to maintain the best seal. A model of the piston/cylinder seal displayed the need for a viscosity of approximately 50 cSt at the operating temperature and shaft speeds of the compressor.

The motor assembly is used to spin the crankshaft of the compressor. The motor shaft is coupled to the crankshaft of the compressor by a telescoping universal joint. The motor assembly housing and compressor housing are connected by a spacer piece and held in place by eight socket head screws.

Figure 10:
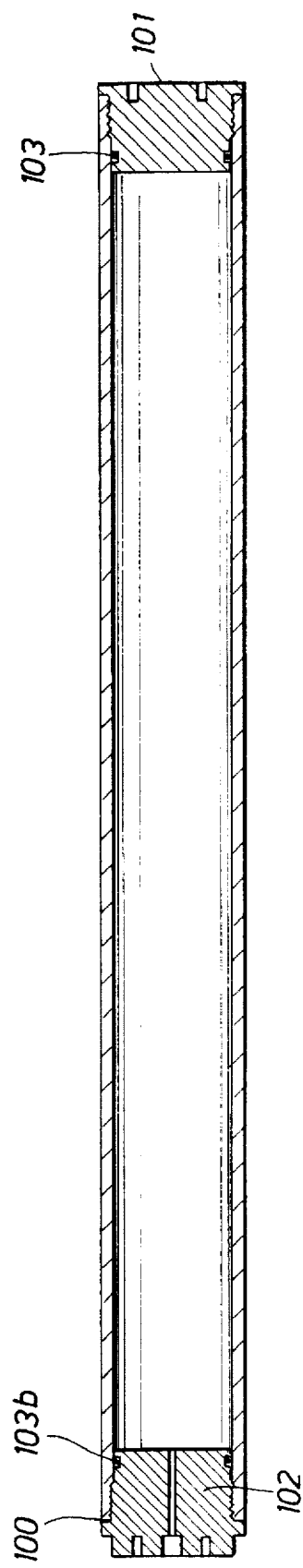
FIG. 10 is a diagram of the hot heat exchanger upper tank assembly of the present invention.

The hot heat exchanged upper tank assembly is shown in FIG. 10. The assembly comprises an upper tank 100, uphole 101 and downhole ends 102 and O-rings 103 and 103b, and serves to both store the high pressure steam and conduct heat from the steam to the borehole through its walls. As mentioned above, the tank is made of aluminum which is not compatible with the downhole environment. However, the aluminum housing makes no difference from a heat transfer standpoint in the design. In other words, the limiting resistance to thermal conduction is the borehole film coefficient, not the material of the upper tank. The temperature difference required for the aluminum housing is only 0.3° C. less than that required for the downhole compatible stainless steel housing.

The original downhole motor/compressor assembly is shown in FIG. 11. The motor assembly is a standard motor containing major parts such as a motor mount 110, a motor end 111, motor add-on shaft 112, the pump out motor 113, a motor housing 114, a spacer 115, which perform standard operations. A universal end 116 and female end 117 to connect the motor the compressor. A universal joint 118 connects the motor and compressor and provides the means by which the motor drives the compressor. The universal joint is connected to the compressor by a male end 119. The assembly has an outer diameter of approximately 0.102 m. The ⅔ HP high-temperature downhole motor displayed in the assembly is a commonly used motor in wireline tools. The development of a new motor to fit the geometry constraints does not represent a serious design challenge. However, due to time and costs, a new downhole was not purchased for the uphole prototype.

The method and apparatus of the present invention provides a significant advantage over the prior art. The invention has been described in connection with the preferred embodiments at the time of filing. However, the invention is not limited thereto. Selection of particular materials should be based on the environment in which the apparatus will operate. Changes, variations and modifications to the basic design may be made without departing from the inventive concept in this invention. In addition, these changes, variations modifications would be obvious to those skilled in the art having the benefit of the foregoing teachings contained in this application. All such changes, variations and modifications are intended to be within the scope of the invention which is limited by the following claims.

I claim:

1. An apparatus for actively cooling instrumentation contained in a logging tool comprising:
    a) a first container having a cooling agent therein, said container being located adjacent said instrumentation;
    b) a heat exchanger in thermal communication with said first container and said instrumentation for transferring heat from said instrumentation to said cooling agent in said container;
    c) a second container for receiving the heated, cooling agent; and
    d) a compressor in fluid communication with said first container for extracting said heated, cooling agent from said first container and compressing said heated, cooling agent, said compressor further in fluid communication with said second container for transferring said compressed, heated cooling agent to said second container.

2. The apparatus of claim 1 wherein said first and second containers are near and far tanks respectively in relation to said instrumentation.

3. The apparatus of claim 2 wherein said near tank is connected to said instrumentation via said heat exchanger.

4. The apparatus of claim 2 further comprising an insulated flask for containing said near tank, said heat exchanger and said instrumentation.

5. The apparatus of claim 4 wherein said instrumentation is electronic circuits.

6. The apparatus of claim 1 wherein said cooling agent is water.

7. The apparatus of claim 6 further comprising a vapor control system to maintain a constant pressure vaporization of said cooling agent in said near tank.

8. The apparatus of claim 7 further comprising a pressure controller to maintain pressure in said far tank of steam which results from heating said cooling agent.

9. The apparatus of claim 8 wherein the pressure of said steam is measured by a pressure gauge inside said near tank.

10. The apparatus of claim 1 wherein said compressor is a positive displacement steam compressor.

11. The apparatus of claim 7 wherein said control means is located such that said control means controls vapor entering said compressor means and vapor exiting said compressor means.

12. The apparatus of claim 8 further comprising a pressure sensing means for detecting pressure of cooling agent when said cooling agent is transformed from a liquid state to a vapor state.

13. A method of actively cooling instrumentation contained in a logging tool comprising the steps of:
    a) transferring heat from said instrumentation to a cooling agent stored in a tank adjacent said instrumentation;
    b) allowing sufficient heat to transfer such that said cooling agent begins to boil thereby creating stem and vapor;
    c) removing said steam and vapor portion of said cooling agent from said tank;
    d) compressing said steam and vapor portion; and,
    e) transferring said compressed steam and vapor portion into a second tank.

14. The method of claim 13 wherein the steam and vapor portion of said cooling agent is removed from said tank by:
    pumping said steam and vapor from said cooling agent tank; and
    regulating the flow rate of said steam and vapor from said cooling agent tank to maintain a desired vapor pressure.

15. The method of claim 14 wherein said vaporized cooling agent is maintained at a pressure of approximately $1.01 \times 10^3$ Pa.

16. The method of claim 13 further comprising the step of condensing said steam and vapor into liquid cooling agent.

* * * * *